United States Patent
Agrawal et al.

(10) Patent No.: US 10,020,034 B2
(45) Date of Patent: *Jul. 10, 2018

(54) SYSTEMS, METHODS, AND DEVICES FOR PARALLEL READ AND WRITE OPERATIONS

(71) Applicant: Cypress Semiconductor Corporation, San Jose, CA (US)

(72) Inventors: Vineet Agrawal, San Jose, CA (US); Roger Bettman, Los Altos, CA (US); Samuel Leshner, Los Gatos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/463,702

(22) Filed: Mar. 20, 2017

(65) Prior Publication Data
US 2017/0249978 A1 Aug. 31, 2017

Related U.S. Application Data

(63) Continuation of application No. 14/978,733, filed on Dec. 22, 2015, now Pat. No. 9,627,016.
(Continued)

(51) Int. Cl.
*G11C 7/22* (2006.01)
*G11C 7/18* (2006.01)
(Continued)

(52) U.S. Cl.
CPC .............. *G11C 7/18* (2013.01); *G06F 12/023* (2013.01); *G11C 5/147* (2013.01); *G11C 7/06* (2013.01);
(Continued)

(58) Field of Classification Search
CPC .... G11C 7/18; G11C 7/06; G11C 7/12; G11C 7/22; G11C 5/147; G06F 12/023; G06F 2212/1044
(Continued)

(56) References Cited

U.S. PATENT DOCUMENTS 5,126,970 A  6/1992 Haq
5,894,437 A  4/1999 Pellegrini
(Continued)

OTHER PUBLICATIONS

EBVElektronik, Memories Embedded Storage Solutions, dated Jun. 2013; 44 pages.
(Continued)

*Primary Examiner* — Tha-O H Bui

(57) ABSTRACT

Disclosed herein are systems, methods, and devices for parallel read and write operations. Devices may include a first transmission device coupled to a local bit line and a global bit line associated with a memory unit of a memory array. The first transmission device may be configured to selectively couple the global bit line to the local bit line. The devices may further include a first device coupled to the local bit line and a sense amplifier. The first device may be configured to selectively couple the local bit line to the sense amplifier. The devices may also include a second device coupled to the local bit line and an electrical ground. The second device may be configured to selectively couple the local bit line to the electrical ground.

18 Claims, 7 Drawing Sheets

Related U.S. Application Data

(60) Provisional application No. 62/216,896, filed on Sep. 10, 2015.

(51) Int. Cl.
*G11C 5/14* (2006.01)
*G06F 12/02* (2006.01)
*G11C 7/12* (2006.01)
*G11C 7/06* (2006.01)

(52) U.S. Cl.
CPC .................. *G11C 7/12* (2013.01); *G11C 7/22* (2013.01); *G06F 2212/1044* (2013.01)

(58) Field of Classification Search
USPC .................................................... 365/189.15
See application file for complete search history.

(56) References Cited

U.S. PATENT DOCUMENTS

| | | | |
|---|---|---|---|
| 6,014,328 A | 1/2000 | Onakado et al. | |
| 6,522,565 B2 | 2/2003 | Shimazaki et al. | |
| 6,950,337 B2 | 9/2005 | Bellini et al. | |
| 7,126,855 B2 | 10/2006 | Honda et al. | |
| 7,149,120 B2 | 12/2006 | Lee et al. | |
| 7,724,071 B2 | 5/2010 | Okada et al. | |
| 8,225,242 B2 | 7/2012 | Cernea | |
| 9,627,016 B2 * | 4/2017 | Agrawal | G06F 12/023 |
| 2003/0021159 A1 | 1/2003 | Issa | |
| 2004/0095825 A1 | 5/2004 | Tanizaki et al. | |
| 2004/0156235 A1 * | 8/2004 | Bellini | G11C 16/26 365/185.13 |
| 2005/0207247 A1 * | 9/2005 | Honda | G11C 8/12 365/202 |
| 2005/0226025 A1 | 10/2005 | Kang | |
| 2007/0177423 A1 | 8/2007 | Cho | |
| 2008/0080247 A1 | 4/2008 | Chang | |
| 2009/0147590 A1 | 6/2009 | Correale et al. | |
| 2012/0063241 A1 | 3/2012 | Kajigaya | |
| 2012/0147686 A1 | 6/2012 | Takayama et al. | |
| 2012/0181600 A1 | 7/2012 | Higashi | |
| 2012/0195146 A1 | 8/2012 | Jun et al. | |
| 2013/0219111 A1 | 8/2013 | Bolanowski | |
| 2013/0264640 A1 | 10/2013 | Salman et al. | |
| 2014/0071731 A1 | 3/2014 | Schmitt et al. | |
| 2014/0198595 A1 | 7/2014 | Le et al. | |

OTHER PUBLICATIONS

International Search Report for International Application No. PCT/US16/49286 dated Jan. 5, 2017; 5 pages.
Macronix International Co., LTD, Using Erase Suspend and Erase Resume Functions in NOR Flash, 10 pages, May 3, 2013.
Spansion LLC, Simultaneous Read/Write versus Erase Suspend/Resume, 5 pages, Jul. 25, 2011.
USPTO Non-Final Rejection for U.S. Appl. No. 14/978,733 dated Aug. 25, 2016; 5 pages.
USPTO Notice of Allowance for U.S. Appl. No. 14/978,733 dated Mar. 21, 2017; 2 pages.
USPTO Notice of Allowance for U.S. Appl. No. 14/978,733 dated Dec. 14, 2016; 7 pages.
USPTO Requirement for Restriction/Election for U.S. Appl. No. 14/978,733 dated Jun. 14, 2016; 5 pages.
Written Opinion of the International Searching Authority for International Application No. PCT/US16/49286 dated Jan. 5, 2017; 6 pages.

* cited by examiner

SYSTEMS, METHODS, AND DEVICES FOR PARALLEL READ AND WRITE OPERATIONS

CROSS-REFERENCE TO RELATED APPLICATIONS

This application is a Continuation of U.S. patent application Ser. No. 14/978,733, filed Dec. 22, 2015, which claims the benefit of U.S. Provisional Application No. 62/216,896, filed Sep. 10, 2015, which are all incorporated by reference herein in their entirety.

TECHNICAL FIELD

This disclosure generally relates to memories and, more specifically, to read and write operations associated with memories.

BACKGROUND

Memory devices may include memory cell arrays that may be configured as a memory component that stores data values for various other components of a system. Such memory devices identify and access such memory cells based on memory addresses, and corresponding rows and columns associated with such memory addresses and memory cells. Thus, a memory cell may be identified by a particular memory address and may be accessed based on, among other things, a row and column decoders. Moreover, such memory cells may be partitioned into memory units, such as sectors or pages. Thus, addresses associated with memory cells may also identify a memory sector in which a memory cell resides.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Traditional techniques for implementing read and write operations in memory devices are exclusive in that a read operation cannot be implemented in parallel with a write operation. For example, if a particular memory cell within a memory sector is undergoing a write operation, no other operation may be performed on any other memory cells in any other memory sector included in that memory device. For example, a read operation cannot be performed on other memory cells included in other different memory sectors that are not undergoing the write operation. More specifically, if a first memory cell is undergoing a write operation, all bit lines are driven to potentials ranging from VPOS to VNEG. Thus, a second memory cell in a different memory sector cannot undergo a read operation because its bit lines are being driven to voltages ranging from VPOS to VNEG. To implement a read operation, the second memory cell may require a voltage of about 0.6V. Thus, the second memory cell has to wait until the write operation of the first memory cell has completed before it can receive the appropriate voltages on its local bit lines. Moreover, high voltage operations, such as write operations, may generate leakage currents or voltages that may damage memory cells in other memory sectors that may have been left floating.

Various embodiments are disclosed herein that enable the parallel implementation of read and write operations in various memory units of a memory device. Moreover, embodiments as disclosed herein protect memory cells from damage that may otherwise be incurred by leakage currents and voltages. In various embodiments, command and control circuitry as well as switching logic included in a column multiplexer may be configured to selectively couple and decouple local bit lines to and from various other components within the memory device. For example, switching logic included in a column multiplexer may be configured to selectively couple and decouple local bit lines to and from global bit lines, sense amplifiers, and a system ground, which may be an electrical ground, based on one or more signals generated by the command and control circuitry. In this way, different memory units, which may be memory sectors or pages, may be controlled independently to implement read and write operations in different memory units in parallel, and while reducing damage incurred on memory cells due to high voltages used during high voltage operations.

Figure 1:
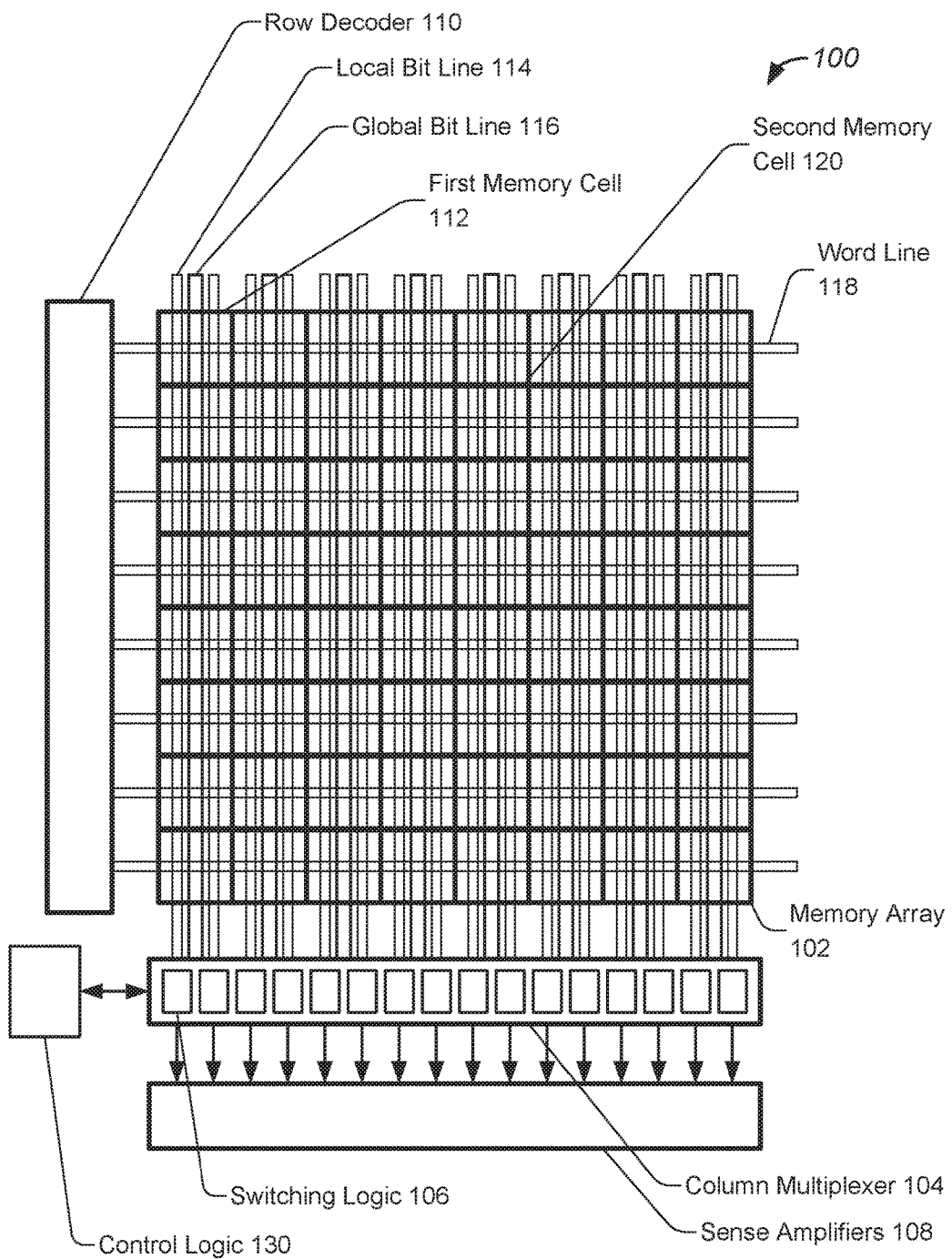
FIG. 1 illustrates an example of a memory device capable of independent read and write operations, configured in accordance with some embodiments.

FIG. 1 illustrates an example of a memory device capable of independent read and write operations, configured in accordance with some embodiments. As will be discussed in greater detail below, a memory device, such as device 100 may include a memory array capable of implementing concurrent read and write operations within memory units included in the same memory device. As previously discussed a memory unit may be a memory sector or a memory page. Thus, device 100 may be configured to independently operate switching logic included in a column multiplexer associated with local bit lines included within the memory units, thus enabling parallel implementations of read and write operations on different memory units, and decreasing the overall cycle time associated with the read and write operations.

In various embodiments, device 100 may include memory array 102 which may include an array of memory cells such as first memory cell 112. Memory array 102 may include non-volatile memory cells which may retain stored data or information regardless of whether or not they are powered. Accordingly, as will be discussed in greater detail below, one or more write operations may be implemented to write and/or erase data values in the memory cells. Moreover, one or more read operations may be implemented to read data values currently stored in the memory cells. In various embodiments, memory cells included in memory array 102, such as first memory cell 112, may be silicon-oxide-nitride-oxide-silicon (SONOS) non-volatile memory cells.

As discussed above, memory array 102 may be divided into several memory units. In some embodiments, a memory unit may be a memory sector or page. As discussed above, various embodiments disclosed herein may be configured to enable a read operation and a write operation to be performed on different memory units within the same memory device, where the read operation and the write operation occur in parallel and independent of each other. In such embodiments, memory cells may be identified based on a combination of a sector identifier, a row identifier, and a column identifier. For example, first memory cell 112 included in the read operation may be identified based on a sector read address, a row read address, and a column read address. Moreover, second memory cell 120 included in the write operation may be identified based on a sector write address and a row write address. As will be discussed in greater detail below, switching logic may include switching devices such as multiplexers, switches, or any other suitable switching or selection device. For example, switching logic may include a multiplexer. Thus, according to various embodiments, switching logic 106 may be a multiplexer configured to enable parallel implementation of the read and write operation on first memory cell 112 and second memory cell 120 based, at least in part, on the received read and write addresses. Furthermore, according to some embodiments, first memory cell 112 and second memory cell 120 may be included a first and second memory unit, respectively.

In various embodiments, memory cells may be selected based on bit lines and word lines. For example, a word line, such as word line 118 may be selected based on, for example, a row address that may identify a row that includes first memory cell 112. Moreover, a local bit line, such as local bit line 114 may be selected based on, for example, a column address that may identify a column that includes first memory cell 112. When the row address and column address are viewed together, they may intersect at first memory cell 112, and first memory cell may be selected. In various embodiments, a memory cell, such as first memory cell may be further selected based on a memory unit address. For example, a sector address may be used to identify a first memory sector that includes first memory cell 112, and may be subject to subsequent read or write operations. In some embodiments, the memory unit address may enable the selection of local bit lines, such as local bit line 114, within the memory unit, and the coupling of the local bit lines to global bit lines, such as global bit line 114, which facilitate driving the local bit lines to electrical potentials utilized during the read and/or write operations. As will be discussed in greater detail below, switching logic, such as switching logic 106 coupled to the local bit lines may be configured to selectively couple local bit lines within a memory unit to, among other things, the global bit lines, thus enabling the parallel implementation of read and write operations among different memory units within the same memory device.

Device 100 may include row decoder 110 which may be configured to decode a received row address and apply a voltage to a particular word line based on the decoded row address. In this way, row decoder 110 may be configured to select a row for one or more read or write operations based on a received row address. Device 100 may further include column multiplexer 104 which may be configured to receive a column address and apply a voltage to switching logic, that may include one or more multiplexers associated with particular bit lines, based on the received column address. In this way, column multiplexer 104 may be configured to select a column for one or more read or write operations based on a received column address. According to some embodiments, column multiplexer 104 may include switching logic associated with memory columns, such as switching logic 106. As will be discussed in greater detail below with reference to FIG. 2A and FIG. 2B, switching logic 106 may be configured to selectively couple individual local bit lines within a particular memory unit to a particular electrical potential. In doing so, switching logic 106 may be configured to enable the independent operation of local bit lines within a memory unit, which may enable the parallel implementation of read and write operations within different memory units of the same memory device.

Moreover, the operation of column multiplexer 104 may be controlled, at least in part, by control logic, such as control logic 130 that may be included in command and control circuitry discussed in greater detail below with reference to FIG. 6. The configuration and operation of control logic 130, such as the generation of various signals, is discussed in greater detail below with reference to FIGS. 2A and 2B, as well as Tables 1 and 2.

Device 100 may further include sense amplifiers 108 which may be configured to obtain one or more electrical measurements from a selected memory cell. For example, during a read operation, sense amplifiers 108 may be configured to identify an electrical property, such as an electrical potential and/or resistance, associated with a selected memory cell. The electrical property may be indicative of a data value stored by the memory cell. Thus, according to some embodiments, sense amplifiers 108 or another system component as discussed in greater detail below with reference to FIG. 6, may be further configured to determine a data value stored within the memory cell based on the identified electrical property.

Figure 2A:
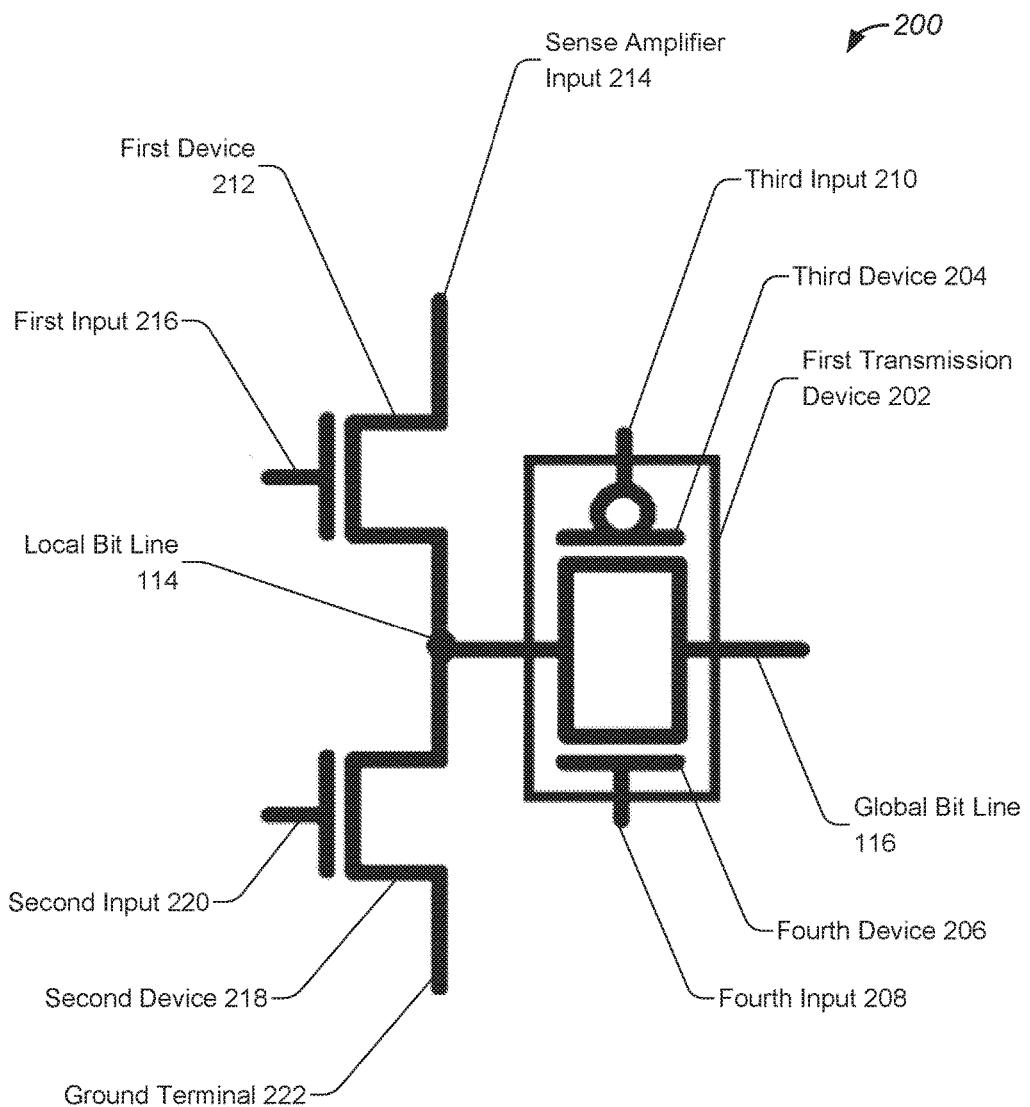
FIG. 2A illustrates an example of switching logic configured to enable independent read and write operations, in accordance with various embodiments.

FIG. 2A illustrates an example of switching logic configured to enable independent read and write operations, in accordance with various embodiments. As discussed above, switching logic may include multiplexers that may be implemented to selectively couple local bit lines to one or more other components, such as sense amplifiers, global bit lines, or a system ground. As will be discussed in greater detail below, switching logic, such as switching logic 200, may be configured to enable the protection of components associated with a memory array, such as sense amplifiers and column multiplexers during high voltage operations that may be performed on other portions of the memory device. Moreover, the switching logic may also be configured to enable the implementation of a parallel read operation during a write operation by selectively providing a discharge path at the appropriate times during each respective operation.

Switching logic 200 may include first transmission device 202 which may be configured to selectively couple or decouple local bit line 114 from global bit line 116. Accordingly, global bit line 116 may be driven to one or more potentials, as discussed in greater detail below with reference to Table 1 and Table 2, and may be selectively coupled to various local bit lines, such as local bit line 114, to drive the local bit lines at those one or more potentials. In various embodiments, first transmission device 202 may include one or more other devices which may be configured to control the coupling and decoupling of global bit line 116 and local bit line 114 based on one or more received input signals. For example, first transmission device 202 may include third device 204 and fourth device 206 which may each be transistors. In one example, third device 204 may be a p-type transistor and fourth device 206 may be an n-type transistor. Third device 204 may be configured to be gated by a third input signal received at third input 210. Moreover, fourth device 206 may be configured to be gated by a fourth input signal received at fourth input 208. Thus, the third input signal and the fourth input signal may, in combination, control coupling between global bit line 116 and local bit line 114. Moreover, a signal applied to or represented by each of the third input signal and the fourth input signal may vary or change depending upon the mode or operation being implemented, as will be discussed in greater detail below with reference to Table 1 and Table 2.

Switching logic 200 may further include first device 212 which may be configured to selectively couple or decouple a sense amplifier, which may have associated sense amplifier input 214, with local bit line 114. Accordingly, first device 212 may be configured to couple local bit line 114 with sense amplifier input 214 during a portion of a read operation associated with a memory cell that may be coupled to local bit line 114. In this way, first device 212 may be configured to provide coupling between the memory cell and a sense amplifier coupled to sense amplifier input 214 such that the sense amplifier may obtain one or more measurements from the memory cell. In various embodiments, first device 212 may be a transistor that may be gated by a third signal received at first input 216 associated with first device 212. For example, the third signal may be applied to the gate of the transistor included in first device 212. In this way, a voltage applied to first input 216 may control the coupling and decoupling of the memory cell, local bit line 114, and sense amplifier via controlling operation of first device 212.

Switching logic 200 may further include second device 218 which may be configured to provide a discharge path for local bit line 114 as well as other components of the memory device in which local bit line 114 is implemented. As shown in FIG. 2A, second device 218 may be a transistor that may be gated by a fourth signal received at second input 220. Thus, the fourth signal may control the coupling of local bit line 114 to a system ground via ground terminal 222. In various embodiments, second device 218 may be configured to couple local bit line 114 to ground when a memory unit that includes a memory cell coupled to local bit line 114 is not selected for any operation, as may be the case when the memory unit is not selected for a read, erase, or program operation. When configured in this way, the discharge path may protect the memory cell from leakage from other high voltages that may be applied when other memory units are undergoing other high voltage operations, such as write operations that may be program or erase operations. For example, if a first memory unit is undergoing a write operation, switching logic, that may include multiplexers, included in a second memory unit may be configured to couple its bit lines to ground via second devices, such as second device 218, thus protecting memory cells included within the second memory unit.

Moreover, second device 218, in conjunction with first transmission device 202 and first device 212, may be configured to enable a read operation in a memory unit that may be concurrent with a write operation performed on a different memory unit within the same memory device. For example, a write operation may be performed in a first memory sector and global bit lines may be driven at a high voltage. In this example, first transmission device 202 may be included in a second memory sector that has been selected for a read operation. Accordingly, first transmission device 202 may be configured to decouple global bit line 116 from local bit line 114, first device 212 may be configured to couple local bit line 114 with sense amplifier input 214, and second device 218 may be configured to decouple local bit line 114 from ground terminal 222. In this way, a read operation may be implemented in the second sector while a write operation is performed in the first sector because the second sector is able to drive the local bit lines at the appropriate voltages. Moreover, a third memory sector may be unselected for any operations. In the third memory sector, the global bit line may be decoupled from the local bit lines, the local bit lines may be decoupled from the sense amplifiers, and the local bit lines may be coupled to a system ground.

Figure 2B:
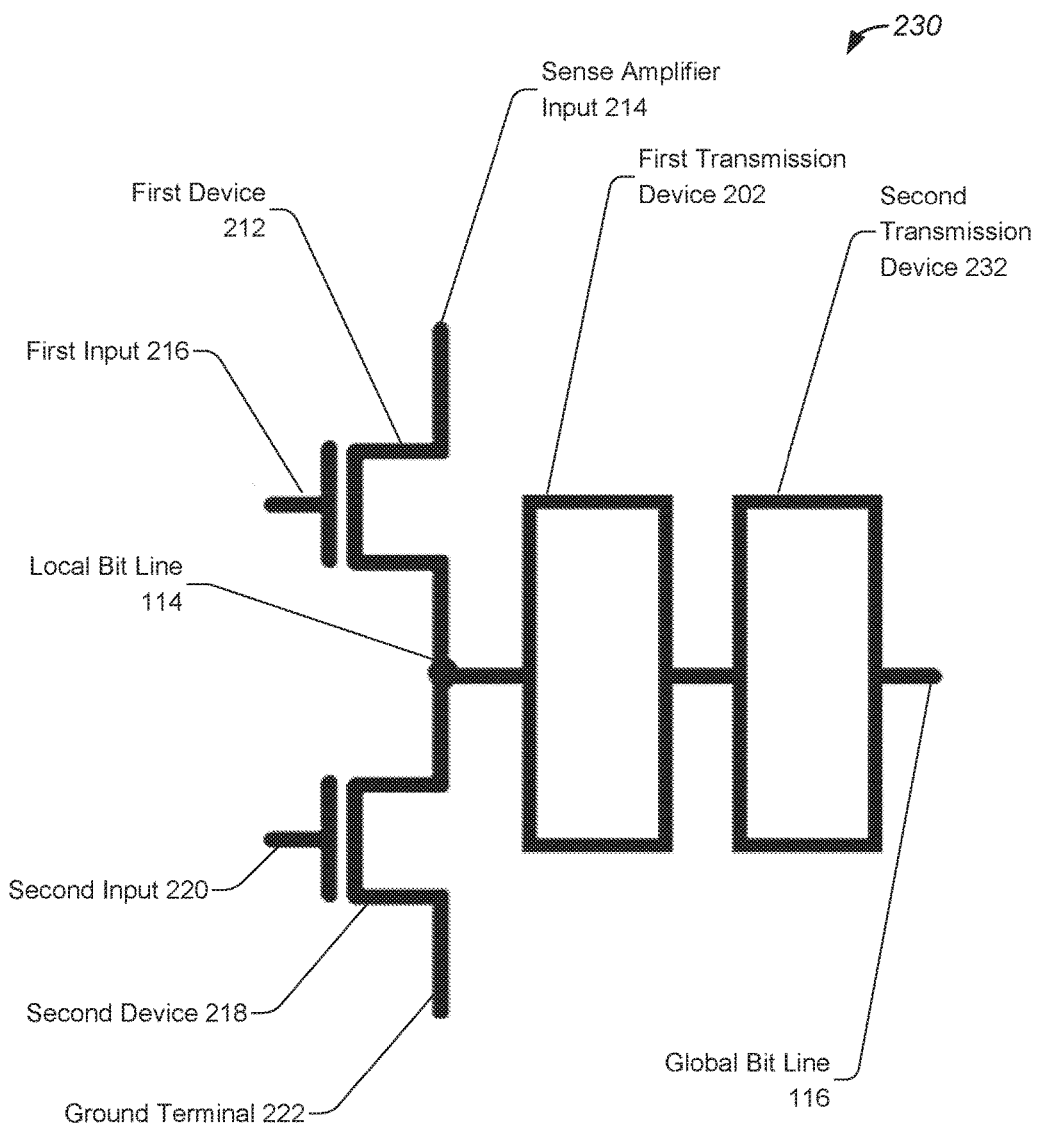
FIG. 2B illustrates another example of switching logic configured to enable independent read and write operations, in accordance with various embodiments.

FIG. 2B illustrates another example of switching logic configured to enable independent read and write operations, in accordance with various embodiments. As similarly discussed above with reference to FIG. 2A, switching logic 230 may include first transmission device 202, global bit line 116, local bit line 114, first device 212, and second device 218. In some embodiments, switching logic 230 may further include second transmission device 232 which may be coupled between first transmission device 202 and global bit line 116. Thus, second transmission device 232 may be configured to provide additional control over the coupling and decoupling of global bit line 116 with local bit line 114. In various embodiments, second transmission device 232 may be implemented when transistors included in switching logic 230 utilize thinner gate oxides with extended drains. Such transistors with thinner gate oxides and extended drains may be able to handle large drain-source currents, but might not handle large gate-drain/gate-source currents. Accordingly, the implementation of second transmission device 232 may increase their tolerance to such currents. In some embodiments, second transmission device 232 may include devices, such as a fifth device and a sixth device that may be similar to third device 204 and fourth device 206 discussed above. The devices, which may be transistors, included in second transmission device 232 may be controlled by additional signals, such as a fifth input signal and sixth input signal. In this way, second transmission device 232 may also be used to selectively couple and decouple global bit line 116 from local bit line 114.

TABLE 1

| Operation | First Unit | Second Unit | GBL | BL | Sense Amp. | 1st input | 2nd input | 3rd input | 4th input |
|---|---|---|---|---|---|---|---|---|---|
| No HV | Unselected | Unselected | 0 | 0 | 0 | 0 | vcc | vcc | 0 |
|  | Selected | Unselected | 0 | 0-.6 | 0-.6 | vcc \| 0 | 0 \| vcc | vcc | 0 |
| Erase | Unselected | Unselected | VPOS | 0 | 0 | 0 | vcc | VPOS | 0 |
|  | Selected | Unselected | VPOS | 0-.6 | 0-.6 | vcc \| 0 | 0 \| vcc | VPOS | 0 |

TABLE 1-continued

| Operation | First Unit | Second Unit | GBL | BL | Sense Amp. | 1st input | 2nd input | 3rd input | 4th input |
|---|---|---|---|---|---|---|---|---|---|
|  | Unselected | Selected | VPOS | VPOS | 0 | 0 | 0 | vcc | vcc |
| Program | Unselected | Unselected | VBL | VNEG | 0 | 0 | 0 | vcc | VBL | VNEG |
|  | Selected | Unselected | VBL | VNEG | 0-.6 | 0-.6 | vcc | 0 | 0 | vcc | VBL | VNEG |
|  | Unselected | Selected | VBL | VNEG | VBL | VNEG | 0 | VNEG | VNEG | 2*Vtp | 0 |

Table 1 shows several voltages that may be applied to various portions of switching logic to implement various read and/or write operations in different operational modes and according to different selection criteria. As shown in Table 1, voltages may be received from several different sources and have different amplitudes. When values shown are separated by a "|", it will be appreciated that values on either side identify values for the first and second memory units respectively. In various embodiments, "operation" may identify to a type of memory operation being implemented in a memory unit. For example, an operation may be a low voltage operation or unselected, and may be identified as "no HV". Furthermore, an operation may be a high voltage operation such as an erase or program operation. Moreover, the first unit and the second unit may be examples of different units that may be undergoing operations in parallel. For example, the first unit may undergo a low voltage operation, such as a read operation, while the second unit may undergo a high voltage operation, such as a write operation. Furthermore, GBL may identify a voltage at a global bit line such as global bit line 116. BL may identify a voltage at a local bit line such as local bit line 114. Moreover, "sense amp." may identify a voltage at a sense amplifier input such as sense amplifier input 214. Further still, $1^{st}$ input, $2^{nd}$ input, $3^{rd}$ input, and $4^{th}$ input may refer to inputs such as first input 216, second input 220, third input 210, and fourth input 208 respectively.

In various embodiments, the values shown in Table 1 may represent various voltages or potentials in various different combinations of memory operations. For example, VPOS may represent a positive charge pump potential and VNEG may represent a negative charge pump potential. Moreover, VBL may represent an intermediate voltage that may be generated using an internal digital-to-analog (DAC) converter. Furthermore, vcc may represent a direct current (DC) core supply voltage. Further still, VtP may represent a threshold voltage associated with a portion of a transmission device, such as third device 204 discussed above. In various embodiments, the voltages discussed in Table 1 may be implemented with drain extended devices that may use drain extended transistors. As discussed above, such voltages may be generated using voltage control circuitry and control logic as discussed above and in greater detail below.

In a first mode of operation in which no high voltage operations are being performed on any memory units within the memory device, and read operations are being performed on one or more memory units, a first and second memory unit may receive voltages as described in the first two rows of Table 1. As shown in Table 1, memory units, which may be memory sectors, which are unselected for any operation may be biased to configure transmission devices to decouple the global bit line from the local bit lines, to configure the first devices to decouple the local bit lines from the sense amplifiers, and to configure the second devices to couple the local bit lines to ground. Moreover, memory units undergoing a read operation may be biased to configure transmission devices to decouple the global bit line from the local bit lines, to configure the first devices to couple the local bit lines to the sense amplifiers, and to configure the second devices to decouple the local bit lines from ground. In this way, unselected memory units may be protected from extraneous voltages, and read operations may be performed simultaneously on multiple memory units within the same memory device.

In a second mode of operation in which high voltage operations, such as erase operations, are being performed on one or more memory units within the memory device, a first and second memory unit may receive voltages as described in rows 3-5 of Table 1. As shown in Table 1, memory units, which may be memory sectors, which are unselected for any operation may be biased to configure transmission devices to decouple the global bit line from the local bit lines, to configure the first devices to decouple the local bit lines from the sense amplifiers, and to configure the second devices to couple the local bit lines to ground. In this instance, the global bit lines are charged to VPOS, and the configuration of the switching logic protects the unselected memory cells from damage that may otherwise occur due to the application of VPOS. Furthermore, a memory unit undergoing an erase operation may be biased to configure transmission device to couple the global bit line to the local bit lines, to configure the first devices to decouple the local bit lines from the sense amplifiers, and to configure the second devices to decouple the local bit lines from a system ground. Accordingly, VPOS may be applied to the local bit lines and to the memory cells coupled to the local bit lines within a memory unit undergoing the erase operation.

Moreover, as discussed above, other memory units included in the same memory device may simultaneously undergo read operations in parallel to the erase operation. For example, memory units selected for a read operation may be biased to configure transmission devices to decouple the global bit line from the local bit lines, to configure the first devices to couple the local bit lines to the sense amplifiers, and to configure the second devices to decouple the local bit lines from a system ground. In this way, unselected memory units may be protected from extraneous voltages, and read operations may be performed simultaneously on multiple memory units and concurrent with an erase operation being performed in the same memory device.

In a third mode of operation in which high voltage operations, such as program operations, are being performed on one or more memory units within the memory device, a first and second memory unit may receive voltages as described in rows 6-8 of Table 1. As shown in Table 1, memory units, which may be memory sectors, which are unselected for any operation may be biased to configure transmission devices to decouple the global bit line from the local bit lines, to configure the first devices to decouple the local bit lines from the sense amplifiers, and to configure the second devices to couple the local bit lines to ground. In this instance, the global bit lines are charged to VBL or VNEG, depending on which data value is being programmed into memory cells undergoing the program operations. Accordingly, the configuration of the switching logic protects the unselected memory cells from damage that may otherwise occur due to the application of the high voltages. Furthermore, a memory unit undergoing a program operation may be biased to configure transmission device to couple the global bit line to the local bit lines, to configure the first devices to decouple the local bit lines from the sense amplifiers, and to configure the second devices to decouple the local bit lines from a system ground. Accordingly, VBL or VNEG may be applied to the local bit lines and to the memory cells coupled to the local bit lines within a memory unit undergoing the program operation.

Moreover, as discussed above, other memory units included in the same memory device may simultaneously undergo read operations in parallel to the program operation. For example, memory units selected for a read operation may be biased to configure transmission devices to decouple the global bit line from the local bit lines, to configure the first devices to couple the local bit lines to the sense amplifiers, and to configure the second devices to decouple the local bit lines from a system ground. In this way, unselected memory units may be protected from extraneous voltages, and read operations may be performed simultaneously on multiple memory units and concurrent with a program operation being performed in the same memory device.

such a method may be implemented to protect memory cells from damage that might otherwise occur during high voltage memory operations.

Accordingly, method 300 may commence with operation 302, during which several addresses associated with memory operations may be received. In various embodiments, the addresses may be addresses that identify one or more memory cells upon which memory operations are to be performed as well as memory units that include those memory cells. For example, the addresses may identify a memory unit address, a row address, and a column address for a read operation to be implemented on a first memory cell in a first memory unit. Moreover, the addresses may further identify a second memory unit address and row address for a write operation to be implemented on a second memory cell in a second memory unit.

Method 300 may proceed to operation 304, during which at least one memory unit may be identified based on the received addresses. In various embodiments, the at least one memory unit identified may be the memory unit upon which the memory operation is to be implemented. As discussed above, a first memory unit may be identified based on the first received memory unit address. Moreover, a second memory unit may be identified based on the second memory unit address. Further still, types of operations associated with each memory unit may be identified. For example, a low voltage or read operation may be identified for the first

TABLE 2

| Operation | First Unit | Second Unit | GBL | BL | Sense Amp. | 1st input | 2nd input | 3rd input | 4th input |
|---|---|---|---|---|---|---|---|---|---|
| No HV | Unselected | Unselected | 0 | 0 | 0 | 0 | VDD | VDD | 0 |
|  | Selected | Unselected | 0 | 0-.6 | 0-.6 | VDD \| 0 | 0 \| VDD | VDD | 0 |
| Erase | Unselected | Unselected | VPOS | 0 | 0 | 0 | VDD | VPOS | 0 |
|  | Selected | Unselected | VPOS | 0-.6 | 0-.6 | VDD \| 0 | 0 \| VDD | VPOS | 0 |
|  | Unselected | Selected | VPOS | VPOS | 0 | 0 | 0 | 0 | 0 |
| Program | Unselected | Unselected | VBL \| VNEG | 0 | 0 | 0 | VDD | VBL | VNEG |
|  | Selected | Unselected | VBL \| VNEG | 0-.6 | 0-.6 | VDD \| 0 | 0 \| VDD | VBL | VNEG |
|  | Unselected | Selected | VBL \| VNEG | VBL \| VNEG | 0 | VNEG | VNEG | 0 | VDD |

Table 2 shows voltages that may be applied to implement various read and/or write operations as similarly discussed above with reference to Table 1. However, as shown in Table 2 some modifications may be made to the voltages to implement thick gate oxide devices. For example, a voltage VDD may be utilized that represents an input/output (I/O) supply voltage. As shown above, vcc might not be used, and instead different implementations of voltages of VDD and "0" may be used to implement the third input signal, the fourth input signal, the first input signal, and the second input signal. As discussed above, such voltages may be generated using voltage control circuitry and control logic as discussed above and in greater detail below.

While Table 1 and Table 2 provide examples of voltages that may be used in various embodiments, it will be appreciated that various other ranges of other suitable voltages may be used as well. Accordingly, the voltages provided in Table 1 and Table 2 are examples of possible voltages, and such examples are not intended to limit the scope of the embodiments described herein.

Figure 3:
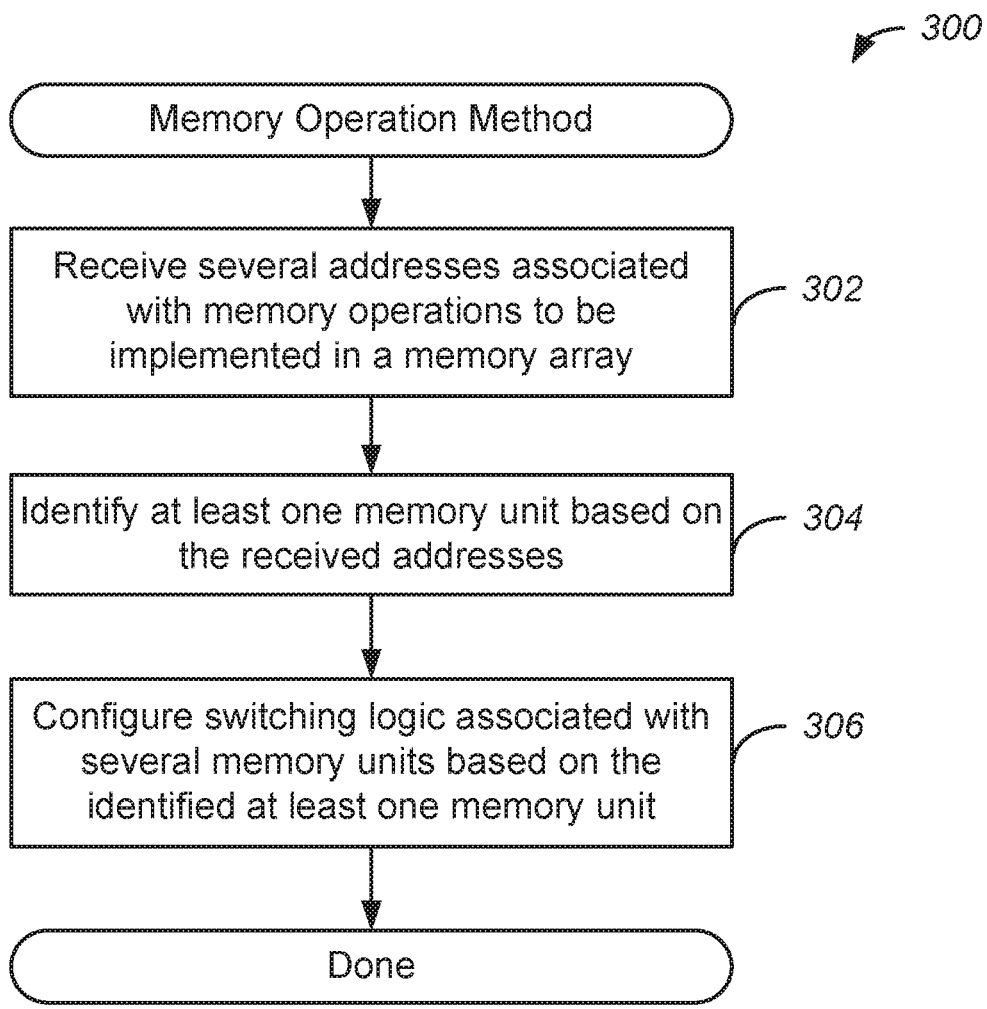
FIG. 3 illustrates a flow chart of an example of a method for implementing memory operations, in accordance with some embodiments.

FIG. 3 illustrates a flow chart of an example of a method for implementing memory operations, in accordance with some embodiments. As will be discussed in greater detail below, a method, such as method 300, may be implemented to enable the parallel implementation of various memory operations, such as read and write operations. Moreover, memory unit based on the type of request being made. Moreover, a high voltage or write operation may be identified for the second memory unit based on the type of request being made. As will be discussed in greater detail below, additional memory units that are unselected, or not selected for any memory operation, may also be identified.

Method 300 may proceed to operation 306, during which switching logic, that may include multiplexers, associated with the identified memory units may be configured. Accordingly, as will be discussed in greater detail below, the switching logic for the memory units may be configured to facilitate the implementation of their respective memory operations. For example, switching logic for a first memory unit may be configured to implement the first memory operation while switching logic for the second memory unit may be configured to implement the second memory operation. Moreover, switching logic for unselected memory units may also be configured. In this way, the first memory unit and the second memory unit may implement their respective memory operations in parallel, and the unselected memory units may be protected from leakage voltages and currents that may be generated by high voltage memory operations.

Figure 4:
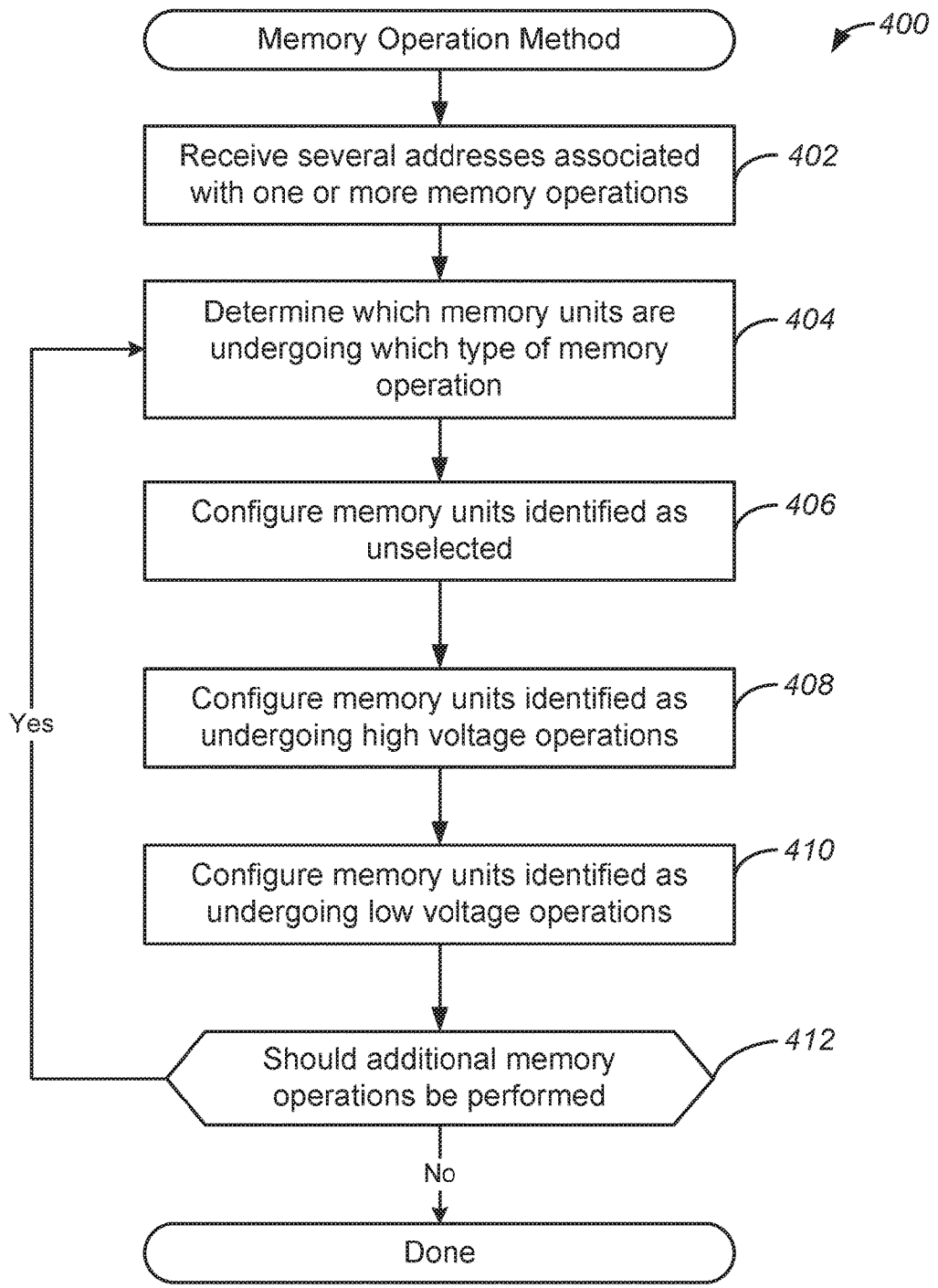
FIG. 4 illustrates a flow chart of another example of a method for implementing memory operations, in accordance with some embodiments.

FIG. 4 illustrates a flow chart of another example of a method for implementing memory operations, in accordance with some embodiments. As will be discussed in greater detail below, addresses associated with memory operations may be received and used to configure memory units within a memory device to implement the memory operations. Such memory operations may be implemented in parallel and independent of each other. In this way, different memory units, such as memory sectors and pages, may be configured to implement memory operations in parallel, and achieve reduced cycle times associated with such operations. Moreover, memory cells may be protected from leakage voltages and currents that may be generated by high voltage memory operations implemented within the memory device.

Method 400 may commence with operation 402, during which several addresses may be received. The addresses may be received from a component, such as a memory controller, and may be received at another component, such as command and control circuitry included in a memory device. As similarly discussed above with reference to FIG. 1, the addresses may include various addresses or identifiers capable of identifying a memory unit and a memory cell associated with a memory operation. For example, the received addresses may identify a memory unit and a memory cell associated with a low voltage operation, such as a read operation. Furthermore, the received addresses may also identify a memory unit and memory cell associated with a high voltage operation, such as a program or erase operation. Accordingly, the addresses received during operation 402 may identify multiple memory cells included in multiple memory units included within a memory device. In one specific example, the received addresses may identify a sector write address and a row write address that may be associated with a first memory cell included in a first memory sector that will undergo a write operation. The received addresses may further identify a memory sector read address, a row read address, and a column read address which may all be associated with a second memory cell included in a second memory sector that will undergo a read operation. In this example, the first and second memory sector may be included in the same memory device, and the read and write operations may be implemented in parallel, as will be discussed in greater detail below.

Method 400 may proceed to operation 404, during which it may be determined which memory units are undergoing which type of memory operation, as well as which memory units will remain unselected. In various embodiments, a system component, such as the command and control circuitry, may be configured to identify several memory units based on the received addresses. As discussed above, the received addresses may include memory unit identifiers that identify which memory unit will be associated with which type of operation. The command and control circuitry may be configured to retrieve the memory unit identifiers and determine an operation status, which may be a mode of operation, for each memory unit included in the memory device. For example, the command and control circuitry may have a predetermined list of all memory units, which may be sectors or pages, within the memory device. Based on the received memory unit addresses and the types of memory operations associated with the received memory unit addresses, the command and control circuitry may identify all memory units that will undergo high voltage operations, identify all memory units that will undergo low voltage operations, and all remaining memory units may be identified and designated as unselected. In a specific example, the command and control circuitry may generate a list of all memory units that will undergo read operations, all memory units that will undergo erase operations, all memory units that will undergo program operations, and all memory units that are unselected. In this way, the received addresses may be used to determine an operational mode of each memory unit included in the memory device.

Method 400 may proceed to operation 406, during which memory units identified as unselected may be configured. As discussed above with reference to FIGS. 2A and 2B as well as Tables 1 and 2, during operation 406 command and control circuitry may generate and apply one or more signals to switching logic included in a component, such as a column multiplexer, to configure the unselected memory units. For example, the switching logic may include multiplexers that may receive the generated signals and may be biased to configure transmission devices to decouple global bit lines from local bit lines, decouple the local bit lines from the sense amplifiers, and couple the local bit lines to ground. In this way, unselected sectors may have local bit lines coupled to a system ground and may be protected from damage that may be incurred by leakage voltages that may be generated by high voltage operations that may be implemented in other memory units.

Method 400 may proceed to operation 408, during which memory units identified as undergoing high voltage memory operations may be configured. As also discussed above with reference to FIGS. 2A and 2B as well as Tables 1 and 2, during operation 408 command and control circuitry may generate and apply one or more signals to switching logic included in a component, such as a column multiplexer, to configure the memory units undergoing high voltage operations. In one example, a memory unit, which may be a memory sector or page, may be undergoing an erase operation. Accordingly, command and control circuitry may generate and apply signals to bias multiplexers of the switching logic included in the column multiplexer to couple global bit lines to the local bit lines, to decouple the local bit lines from the sense amplifiers, and to decouple the local bit lines from a system ground. Accordingly, a generated voltage, such as VPOS generated by a positive voltage pump, may be applied to the local bit lines and to the memory cells coupled to the local bit lines within a memory unit undergoing the erase operation.

In another example, the memory unit may be undergoing a program operation. Thus, command and control circuitry may generate and apply signals to bias multiplexers of the switching logic included in the column multiplexer to couple the global bit lines to the local bit lines, to decouple the local bit lines from the sense amplifiers, and to decouple the local bit lines from a system ground. In this way, a generated voltage, such as VBL or VNEG generated by a DAC and/or a negative voltage pump, may be applied to the local bit lines and to the memory cells coupled to the local bit lines within a memory unit undergoing the program operation.

Method 400 may proceed to operation 410, during which low voltage memory operations may be implemented in the memory units identified as undergoing low voltage memory operations. As additionally discussed above with reference to FIGS. 2A and 2B as well as Tables 1 and 2, during operation 408 command and control circuitry may generate and apply one or more signals to switching logic included in a component, such as a column multiplexer, to configure the memory units undergoing low voltage operations. In one example, such memory units may be undergoing read operations. Accordingly, command and control circuitry may generate and apply signals to bias multiplexers included in switching logic that may be included in the column multiplexer. Such biasing may decouple the global bit lines from the local bit lines, to decouple the local bit lines from the system ground, and to couple the local bit lines to the sense amplifiers. In this way, memory units identified for low voltage operations such as read operations may be configured to implement such operations independently of high voltage write operations that may be implemented in other memory units.

Moreover, as discussed above, the low voltage read operations may be implemented concurrently and parallel with the high voltage write operations. Accordingly, each of operations 406, 408, and 410 may be performed in parallel and simultaneously. In this way, the configuring of the unselected memory units, the high voltage memory units, and the low voltage memory units may be performed in parallel. Then, the high voltage operations and the low voltage operations may be implemented in their respective memory units concurrently and in parallel. As discussed in greater detail below, read operations may occupy much less time that write operations. Accordingly, numerous different read operations may be performed in parallel with a single write operation. For example, tens or hundreds of thousands of read operations may be performed in parallel with a single write operation as described above. Accordingly, while method 400 illustrates a single iteration of operation 406 and 410, it will be appreciated that numerous iterations of each operation may be performed during a single iteration of operation 408.

Method 400 may proceed to operation 412, during which it may be determined if other memory operations should be performed. In one example, such a determination may be made based on the addresses received at operation 402, or any other addresses that may have been received since the commencement of method 400. If additional addresses still remain in the received addresses, and have not had associated memory operations implemented, a component, such as the command and control circuitry, may determine that additional memory operations should be performed. If it is determined that additional memory operations should be performed, method 400 may return to operation 404. If no additional addresses remain, and it is determined that additional memory operations should not be performed, method 400 may terminate.

Figure 5:
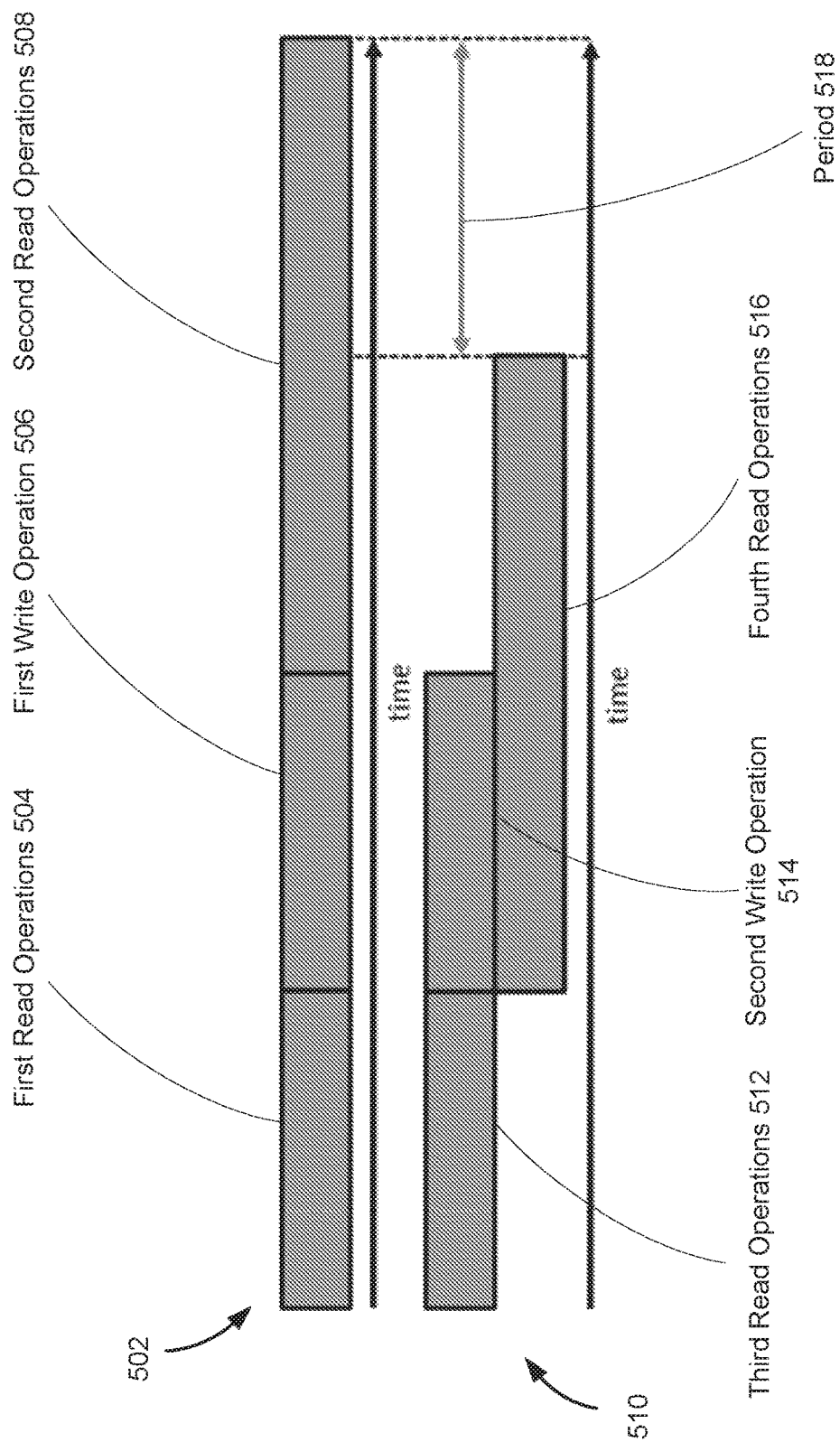
FIG. 5 illustrates an example of an illustration of cycle times associated with low voltage and high voltage memory operations, implemented in accordance with some embodiments.

FIG. 5 illustrates an example of an illustration of cycle times associated with low voltage and high voltage memory operations, implemented in accordance with some embodiments. Cycle 502 illustrates a total cycle time taken to implement first read operations 504, followed by first write operation 506, and followed by second read operations 508. Cycle 502 provides an example of all such operations being performed serially. For example, first read operations 504 may include 100,000 individual read operations, and second read operations 508 may include 200,000 individual read operations. First write operation 506 may be a single write operation. Accordingly, while FIG. 5 may not be to scale, it will be appreciated that a single write operation utilizes a much larger amount of time than a read operation. Accordingly, when read and write operations are exclusive and are performed serially, the memory device must wait until first write operation 506 has completed before implementing second read operations 508 thus resulting in a larger cycle time.

Cycle 510 illustrates a total cycle time taken to implement third read operations 512, followed by second write operation 514, and followed by fourth read operations 516 where fourth read operations 516 are implemented in parallel with second write operation 514. As shown in cycle 510 and as discussed above with regards to the embodiments currently disclosed herein, read operations and write operations may be performed in parallel. Thus, second write operation 514 and fourth read operations 516 may be implemented in parallel and may be started at the same time. Because the memory device does not have to wait for the write operation to complete, the overall cycle time is shorter than the cycle time represented in cycle 502. A savings in cycle time is represented in FIG. 5 by period 518. Accordingly, implementation of the parallel read and write operations as disclosed herein may result in a cycle time savings or improvement represented by, for example, period 518.

Figure 6:
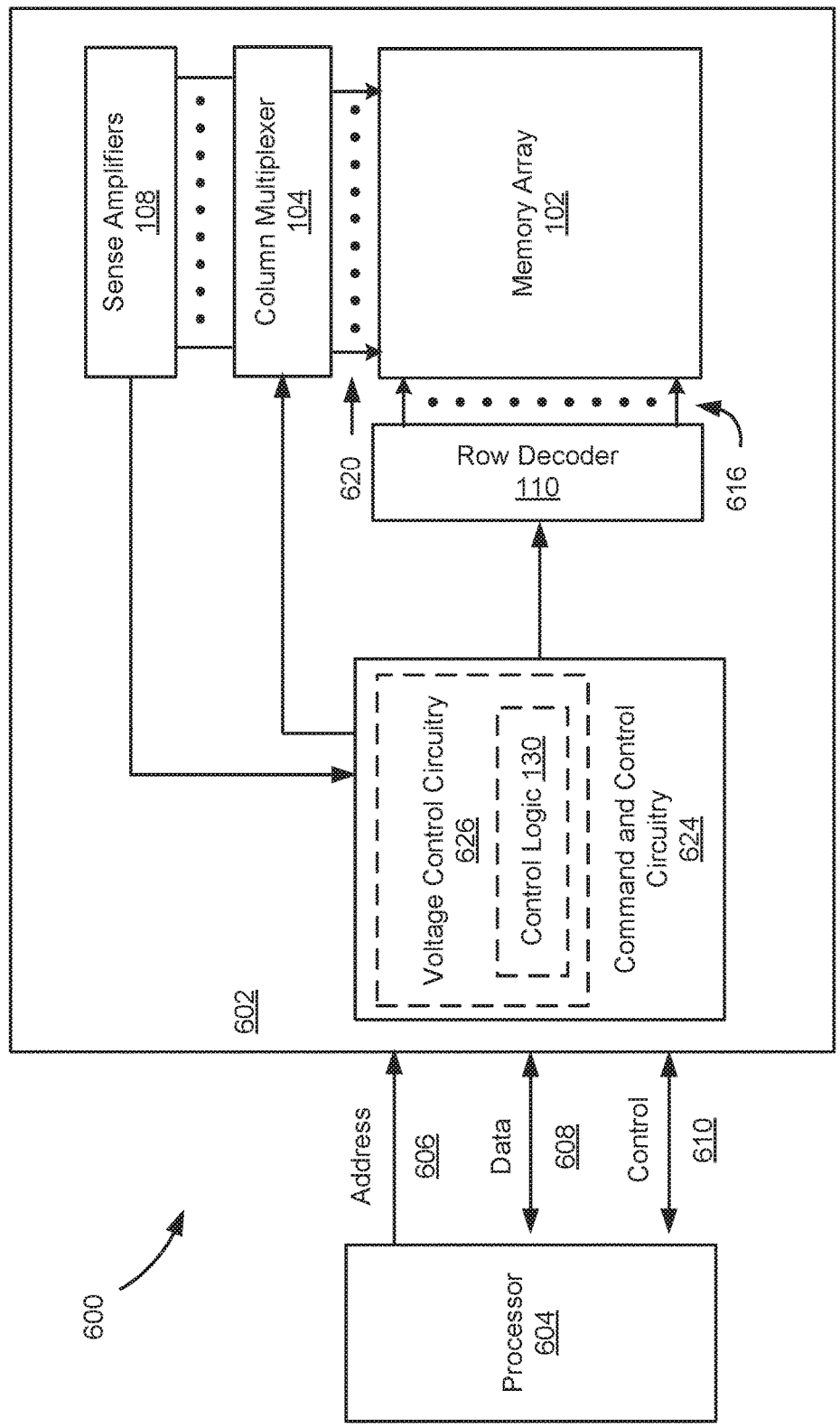
FIG. 6 illustrates a block diagram of a processing system including a memory device, implemented in accordance with some embodiments.

FIG. 6 illustrates a block diagram of a processing system including a memory device, implemented in accordance with some embodiments. Processing system 600 generally includes non-volatile memory 602 coupled to processor 604 in a conventional manner via address bus 606, data bus 608, and control bus 610. It will be appreciated by those skilled in the art that the processing system of FIG. 6 has been simplified for the purpose of illustrating the present invention and is not intended to be a complete description.

In various embodiments, processing system 600 may include processor 604 which may be a type of general purpose or special purpose processing device. For example, in one embodiment the processor can be a processor in a programmable system or controller that further includes a non-volatile memory, such as a Programmable System On a Chip or PSoC™ controller, commercially available from Cypress Semiconductor of San Jose, Calif.

Non-volatile memory 602 may include memory array 102 as discussed above with reference to FIG. 1. Accordingly, memory array 102 may be organized as rows and columns of non-volatile memory cells (not shown in this figure) as described above. Memory array 102 is coupled to row decoder 110 via multiple select lines and read lines 616 (at least one select line and one read line for each row of the memory array). Memory array 102 is further coupled to column multiplexer 104 via multiple bit lines 620 as described above. It will be appreciated that common source lines may be implemented as part of lines 620 or lines 616 as described above. Memory array 102 may be coupled to a plurality of sense amplifiers 108 to read multi-bit words therefrom. Non-volatile memory 602 further includes command and control circuitry 624 to control row decoder 110, column multiplexer 104, and sense amplifiers 108, and to receive read data from sense amplifiers 108. Command and control circuitry 624 includes voltage control circuitry 626 to generate the voltages needed for operation of memory array 102, which may be routed through voltage control circuitry 626 to row decoder 110 and column multiplexer 104. Voltage control circuitry 626 operates to apply appropriate voltages to the memory cells during read, erase and program operations. Accordingly, voltage control circuitry may include control logic, such as control logic 130, a high voltage pump, a low voltage pump, as well as one or more digital-to-analog converters (DACs) that may each be configured to generate signals as discussed above. For example, voltage control circuitry 626 may be configured to generate the first signal, the second signal, the third signal, and the fourth signal discussed above. Voltage control circuitry may be further configured to generate voltages such as vcc, VDD, VPOS, VNEG, VBL, and 2*VtP as discussed above.

In various embodiments, command and control circuitry 624 may be further configured to control row decoder 110 to select a first row of memory array 102 for a program operation by applying a voltage to a first select line in the first row and to deselect a second row of the memory array by applying another voltage to a second select line in the second row. Command and control circuitry 624 may be further configured to control column multiplexer 104 to select a memory cell in the first row for programming by applying a voltage to a first bit line in a first column, and to inhibit an unselected memory cell in the first row from programming by applying another voltage to a second bit line in a second column. Row decoder 110 or column multiplexer 104 may be further configured to apply a voltage to one or more common source lines that may be coupled to memory cells included in memory array 102 as described above.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A method comprising:
receiving in a memory including a plurality of memory units, information associated with operations to be implemented in selected first and second memory units;
configuring the selected first memory unit for a high voltage operation;
configuring the selected second memory unit for a low voltage operation; and
implementing said high and low voltage operations concurrently;
configuring the first memory unit for the high voltage operation comprises coupling a global bit line to a local bit line in the first memory unit, and decoupling the local bit line in the first memory unit from a sense amplifier associated with the first memory unit; and
configuring the second memory unit for the low voltage operation comprises decoupling the global bit line from a local bit line in the second memory unit, and coupling the local bit line in the second memory unit to a sense amplifier associated with the second memory unit.

2. The method of claim 1 wherein the low voltage operation is a read operation.

3. The method of claim 2 wherein the high voltage operation is a write operation or an erase operation.

4. A method comprising:
receiving in a memory including a plurality of memory units, information associated with operations to be implemented in selected first and second memory units;
configuring the selected first memory unit for a high voltage operation;
configuring the selected second memory unit for a low voltage operation; and
implementing said high and low voltage operations concurrently,
wherein the plurality of memory units further includes an unselected third memory unit, and the method further comprises configuring the unselected third memory unit to protect the unselected third memory unit from damage due to leakage voltage from the high voltage operation,
wherein configuring the unselected third memory unit comprises coupling a local bit line in the unselected third memory unit to an electrical ground in response to receiving in the memory information associated with operations to be implemented in selected first and second memory units.

5. A method comprising:
receiving in a memory including a plurality of memory units, each including a number of memory cells, information associated with a high voltage operation to be implemented in a first memory unit of the plurality of memory units;
coupling a global bit line to a local bit line in the first memory unit, and decoupling the local bit line in the first memory unit from a sense amplifier associated with the first memory unit;
receiving in the memory information associated with a low voltage operation to be implemented in a second memory unit of the plurality of memory units concurrently with the high voltage operation; and
decoupling the global bit line from a local bit line in the second memory unit, and coupling the local bit line in the second memory unit to a sense amplifier associated with the second memory unit.

6. The method of claim 5 wherein the plurality of memory units further includes a third memory unit, and wherein the method further comprises coupling a local bit line in at least one memory cell in the third memory unit to an electrical ground in response to receiving in the memory the information associated with the high voltage operation or the low voltage operation.

7. The method of claim 5 wherein the low voltage operation is a read operation implemented concurrently with the high voltage operation.

8. The method of claim 7 wherein the high voltage operation is a write operation implemented concurrently with the read operation.

9. The method of claim 7 wherein the high voltage operation is an erase operation implemented concurrently with the read operation.

10. The method of claim 5 wherein receiving in the memory the information associated with the low voltage operation is concurrent with receiving in the memory information associated with the high voltage operation.

11. The method of claim 5 wherein receiving in the memory the information associated with the low voltage operation precedes receiving in the memory the information associated with the high voltage operation.

12. A method comprising:
receiving in a memory including a plurality of memory units, each including a number of memory cells, information associated with a high voltage operation to be implemented in a first memory unit of the plurality of memory units;
in response to said information associated with the high voltage operation, configuring first switching logic associated with the first memory unit to couple a global bit line to a local bit line in at least one cell in the first memory unit, and decouple the local bit line in the first memory unit from a sense amplifier associated with the first memory unit;
receiving in the memory information associated with a low voltage operation to be implemented in a second memory unit of the plurality of memory units;
in response to said information associated with the low voltage operation, configuring second switching logic associated with the second memory unit to decouple the global bit line from a local bit line in at least one cell in the second memory unit, and couple the local bit line in the second memory unit to a sense amplifier associated with the second memory unit; and
implementing said high and low voltage operations concurrently.

13. The method of claim 12 wherein the plurality of memory units further includes a third memory unit, and wherein the method further comprises coupling a local bit line in at least one memory cell in the third memory unit to an electrical ground in response to receiving in the memory information associated with the high voltage operation or the low voltage operation.

14. The method of claim 12 wherein the low voltage operation is a read operation implemented concurrently with the high voltage operation.

15. The method of claim 14 wherein the high voltage operation is a write operation implemented concurrently with the read operation.

16. The method of claim 14 wherein the high voltage operation is an erase operation implemented concurrently with the read operation.

17. The method of claim 12 wherein receiving in the memory information associated with the low voltage operation is concurrent with receiving in the memory information associated with the high voltage operation.

18. The method of claim 12 wherein receiving in the memory information associated with the low voltage operation precedes receiving in the memory information associated with the high voltage operation.

* * * * *